(12) United States Patent
Lemson et al.

(10) Patent No.: US 9,419,714 B2
(45) Date of Patent: *Aug. 16, 2016

(54) REMOTELY RECONFIGUREABLE DISTRIBUTED ANTENNA SYSTEM AND METHODS

(71) Applicant: Dali Systems Co. Ltd, George Town Grand Cayman (KY)

(72) Inventors: Paul Lemson, Woodinville, WA (US); Shawn Patrick Stapleton, Burnaby (CA); Sasa Trajkovic, Burnaby (CA); Albert S. Lee, San Mateo, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/169,719

(22) Filed: Jan. 31, 2014

(65) Prior Publication Data

US 2014/0286247 A1 Sep. 25, 2014

Related U.S. Application Data

(63) Continuation of application No. 13/211,243, filed on Aug. 16, 2011, now Pat. No. 8,682,338.

(60) Provisional application No. 61/382,836, filed on Sep. 14, 2010.

(51) Int. Cl.
*H04W 72/00* (2009.01)
*H04B 10/2575* (2013.01)
(Continued)

(52) U.S. Cl.
CPC .......... *H04B 10/2575* (2013.01); *H03F 1/3247* (2013.01); *H03F 3/24* (2013.01);
(Continued)

(58) Field of Classification Search
None
See application file for complete search history.

(56) References Cited

U.S. PATENT DOCUMENTS

| | | | |
|---|---|---|---|
| 5,880,863 A | 3/1999 | Rideout et al. | |
| 6,393,007 B1 * | 5/2002 | Haartsen | H04J 3/1682 370/337 |

(Continued)

FOREIGN PATENT DOCUMENTS

| | | |
|---|---|---|
| CN | 101453699 A | 6/2009 |
| CN | 101453799 A | 6/2009 |

(Continued)

OTHER PUBLICATIONS

International Search Report and Written Opinion of the International Searching Authority for International Application No. PCT/US2011/047999 mailed on Dec. 19, 2011, 7 pages.

(Continued)

*Primary Examiner* — Dominic Rego
(74) *Attorney, Agent, or Firm* — Kilpatrick Townsend & Stockton LLP

(57) ABSTRACT

The present disclosure is a novel utility of a software defined radio (SDR) based Distributed Antenna System (DAS) that is field reconfigurable and support multi-modulation schemes (modulation-independent), multi-carriers, multi-frequency bands and multi-channels. The present disclosure enables a high degree of flexibility to manage, control, enhance, facilitate the usage and performance of a distributed wireless network such as flexible simulcast, automatic traffic load-balancing, network and radio resource optimization, network calibration, autonomous/assisted commissioning, carrier pooling, automatic frequency selection, frequency carrier placement, traffic monitoring, traffic tagging, pilot beacon, etc.

21 Claims, 7 Drawing Sheets

Flexible Simulcast Downlink Example

(51) Int. Cl.
*H03F 1/32* (2006.01)
*H03F 3/24* (2006.01)
*H04L 5/00* (2006.01)
*H04L 25/02* (2006.01)
*H04W 24/02* (2009.01)
*H04W 88/08* (2009.01)

(52) U.S. Cl.
CPC ............ *H04L 5/0048* (2013.01); *H04L 25/02* (2013.01); *H04W 24/02* (2013.01); *H04W 88/085* (2013.01); *H03F 2200/204* (2013.01); *H03F 2201/3224* (2013.01); *H03F 2201/3233* (2013.01)

(56) References Cited

U.S. PATENT DOCUMENTS

| | | | |
|---|---|---|---|
| 6,493,335 | B1 | 12/2002 | Darcie et al. |
| 6,625,429 | B1 | 9/2003 | Yamashita |
| 6,657,993 | B1 | 12/2003 | Casanova et al. |
| 6,724,737 | B1 | 4/2004 | Boyden et al. |
| 6,801,767 | B1 | 10/2004 | Schwartz et al. |
| 7,102,442 | B2 | 9/2006 | Anderson |
| 7,145,704 | B1 | 12/2006 | Islam |
| 7,283,519 | B2 | 10/2007 | Girard |
| 7,362,776 | B2 | 4/2008 | Meier et al. |
| 7,489,632 | B2 | 2/2009 | Lakkakorpi |
| 7,496,367 | B1 | 2/2009 | Ozturk et al. |
| 7,634,536 | B2 | 12/2009 | Halasz |
| 7,765,294 | B2 | 7/2010 | Edwards et al. |
| 7,801,038 | B2 | 9/2010 | Liao et al. |
| 7,826,369 | B2 | 11/2010 | Filsfils et al. |
| 7,855,977 | B2 | 12/2010 | Morrison et al. |
| 8,036,226 | B1 | 10/2011 | Ma et al. |
| 8,098,572 | B2 | 1/2012 | Zhou et al. |
| 8,139,492 | B1 | 3/2012 | Peterson et al. |
| 8,363,628 | B2 | 1/2013 | Chi et al. |
| 8,451,735 | B2 | 5/2013 | Li |
| 8,478,331 | B1 | 7/2013 | Rogers |
| 8,520,603 | B2 | 8/2013 | Kozisek et al. |
| 8,527,003 | B2 | 9/2013 | Gupta et al. |
| 8,682,338 | B2 | 3/2014 | Lemson et al. |
| 8,737,300 | B2 | 5/2014 | Stapleton et al. |
| 2001/0034223 | A1 | 10/2001 | Rieser et al. |
| 2002/0075906 | A1 | 6/2002 | Cole et al. |
| 2002/0086675 | A1 | 7/2002 | Mansour |
| 2002/0093926 | A1 | 7/2002 | Kilfoyle |
| 2003/0021263 | A1 | 1/2003 | Lee |
| 2003/0181221 | A1 | 9/2003 | Nguyen |
| 2004/0053624 | A1 | 3/2004 | Frank et al. |
| 2005/0152695 | A1 | 7/2005 | Sulzberger et al. |
| 2005/0181812 | A1* | 8/2005 | Scheck ................ H04W 64/00 455/507 |
| 2005/0206564 | A1 | 9/2005 | Mao et al. |
| 2005/0220066 | A1* | 10/2005 | Wal ...................... H04L 25/063 370/343 |
| 2006/0270366 | A1 | 11/2006 | Rozenblit et al. |
| 2007/0019598 | A1 | 1/2007 | Prehofer |
| 2007/0058742 | A1 | 3/2007 | Demarco et al. |
| 2007/0065078 | A1 | 3/2007 | Jiang |
| 2007/0147488 | A1 | 6/2007 | Han |
| 2007/0177552 | A1 | 8/2007 | Wu et al. |
| 2008/0051129 | A1 | 2/2008 | Abe et al. |
| 2008/0146146 | A1 | 6/2008 | Binder et al. |
| 2008/0225816 | A1 | 9/2008 | Osterling et al. |
| 2008/0240036 | A1* | 10/2008 | Liu ...................... H04W 28/08 370/331 |
| 2009/0274048 | A1 | 11/2009 | Sambhwani et al. |
| 2010/0087227 | A1 | 4/2010 | Francos et al. |
| 2010/0136998 | A1 | 6/2010 | Lott et al. |
| 2010/0202565 | A1 | 8/2010 | Abbasfar |
| 2010/0279704 | A1 | 11/2010 | Vachhani |
| 2010/0299173 | A1 | 11/2010 | Zampiello et al. |
| 2010/0311372 | A1 | 12/2010 | Bouyaud et al. |
| 2011/0103309 | A1 | 5/2011 | Wang et al. |
| 2012/0039254 | A1 | 2/2012 | Stapleton et al. |
| 2013/0272202 | A1 | 10/2013 | Stapleton et al. |
| 2014/0313884 | A1 | 10/2014 | Stapleton et al. |
| 2016/0014782 | A1 | 1/2016 | Stapleton et al. |
| 2016/0080082 | A1 | 3/2016 | Lemson et al. |

FOREIGN PATENT DOCUMENTS

| | | |
|---|---|---|
| CN | 101521893 A | 9/2009 |
| CN | 103201958 A | 7/2013 |
| EP | 2606576 | 6/2013 |
| JP | 2004-147009 A | 5/2004 |
| JP | 2007-523577 A | 8/2007 |
| JP | 2007-235738 A | 9/2007 |
| JP | 2007-529926 A | 10/2007 |
| JP | 2008-099137 A2 | 4/2008 |
| JP | 2008-516503 A | 5/2008 |
| JP | 2009-296335 A2 | 12/2009 |
| JP | 2010-166531 A2 | 7/2010 |
| KR | 2009-0088083 A | 8/2009 |
| WO | 00/23956 A1 | 4/2000 |
| WO | 02/23956 A2 | 3/2002 |
| WO | 02/47414 A2 | 6/2002 |
| WO | 2008-146394 A1 | 12/2008 |
| WO | 2008/154077 A1 | 12/2008 |
| WO | 2012/024343 A1 | 2/2012 |
| WO | 2012/024349 A1 | 2/2012 |

OTHER PUBLICATIONS

Non-Final Office Action of May 30, 2013 for U.S. Appl. No. 13/211,243, 10 pages.
Notice of Allowance of Nov. 8, 2013 for U.S. Appl. No. 13/211,243, 11 pages.
International Search Report and Written Opinion of the International Searching Authority for International Application No. PCT/US2011/048004 mailed on Jan. 5, 2012, 6 pages.
International Search Report and Written Opinion of the International Searching Authority for International Application No. PCT/US2011/047995 mailed on Dec. 22, 2011, 7 pages.
Non-Final Office Action for U.S. Appl. No. 13/211,247 mailed on Oct. 10, 2012, 6 pages.
Notice of Allowance for U.S. Appl. No. 13/211,247 mailed on Mar. 13, 2013, 11 pages.
Non-Final Office Action for U.S. Appl. No. 13/211,247 mailed on Jul. 22, 2013, 11 pages.
Final Office Action for U.S. Appl. No. 13/211,247 mailed on Nov. 26, 2013, 13 pages.
Notice of Allowance for U.S. Appl. No. 13/211,247 mailed on Mar. 11, 2014, 10 pages.
Non-Final Office Action for U.S. Appl. No. 13/913,207 mailed on Nov. 20, 2014, 22 pages.
Non-Final Office Action for U.S. Appl. No. 14/260,145 mailed on Jan. 27, 2015, 10 pages.
Non-Final Office Action for U.S. Appl. No. 14/049,405 mailed on Feb. 26, 2016, 21 pages.

* cited by examiner

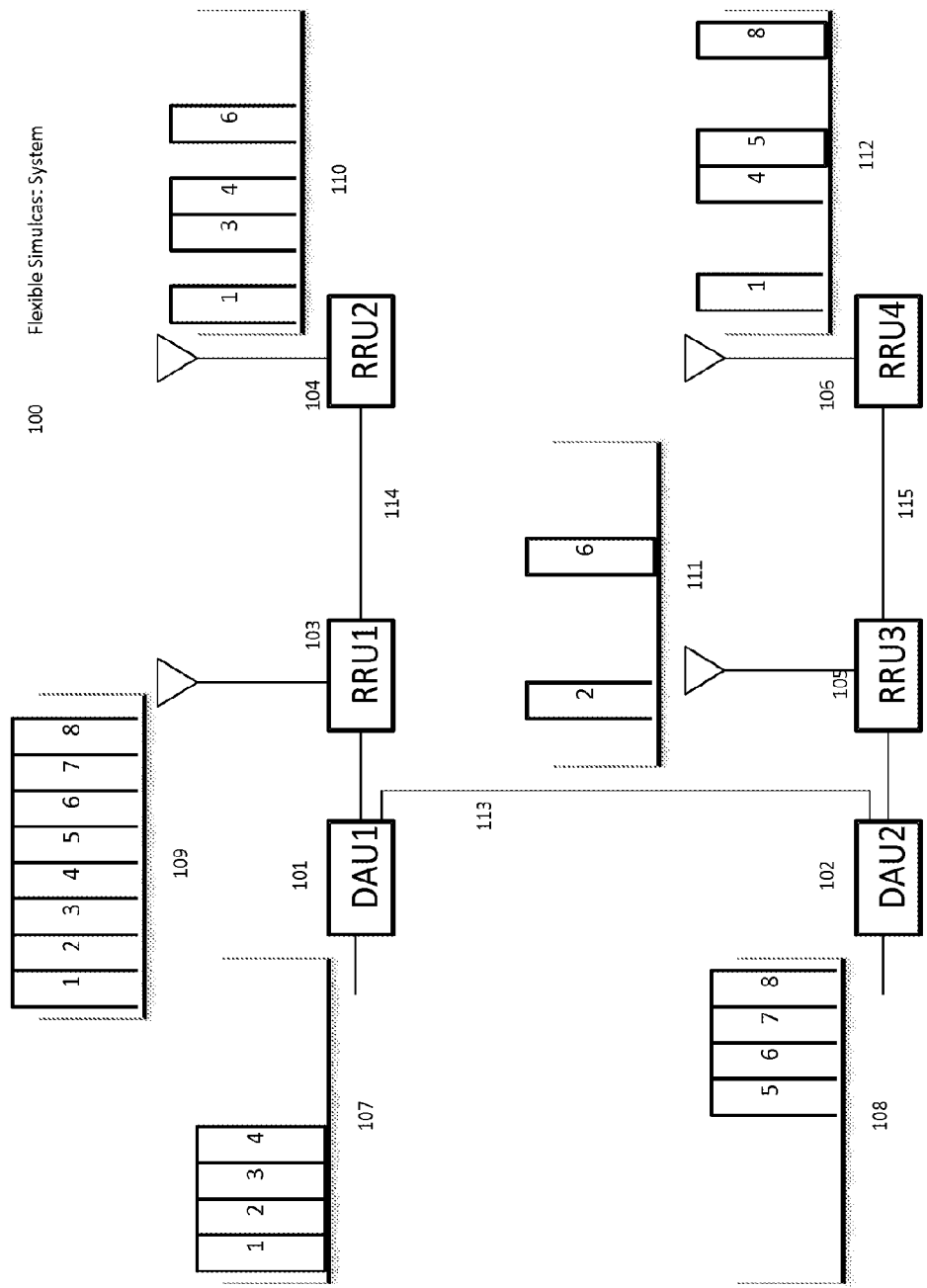
Figure 1: Flexible Simulcast Downlink Example

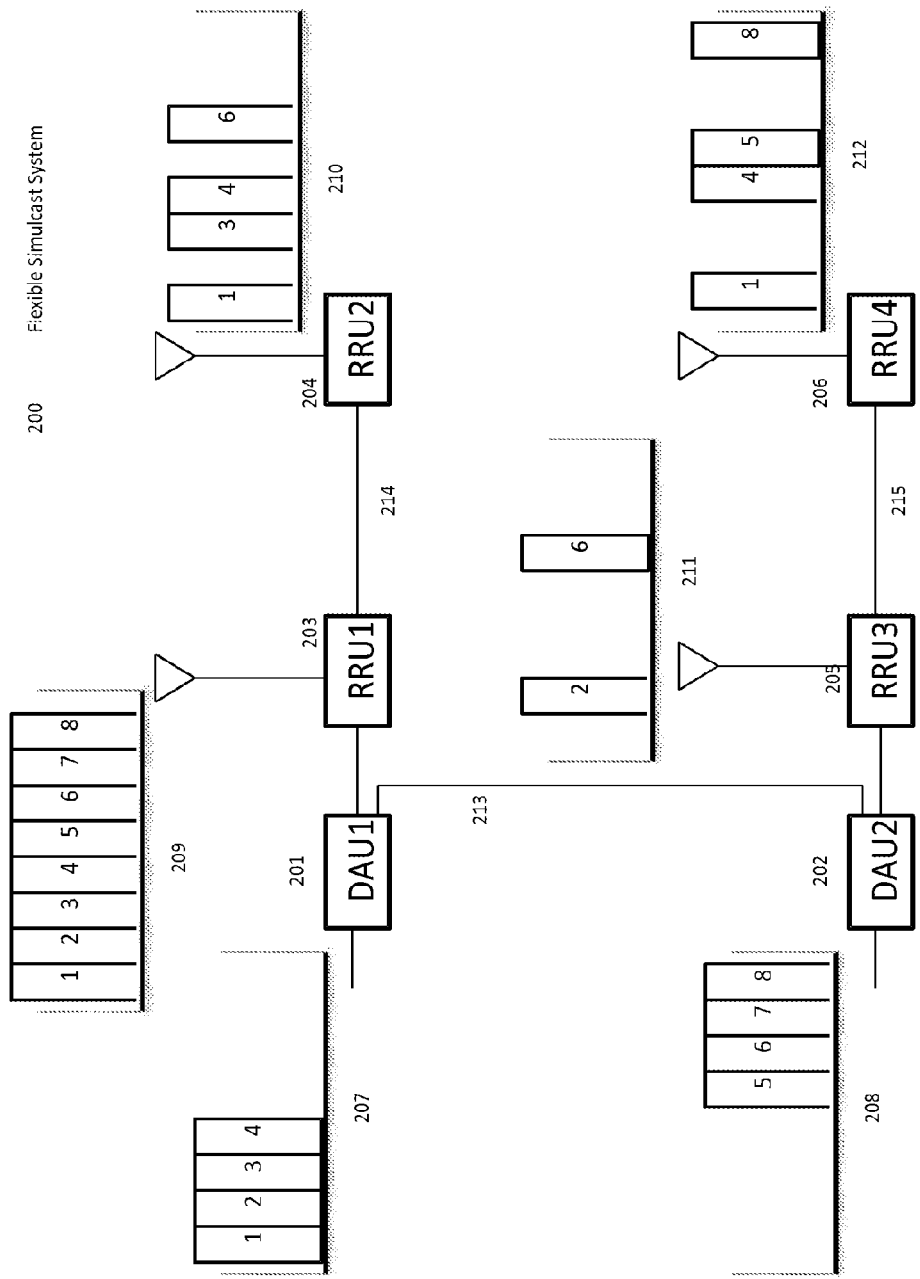
Figure 2: Flexible Simulcast Uplink Example

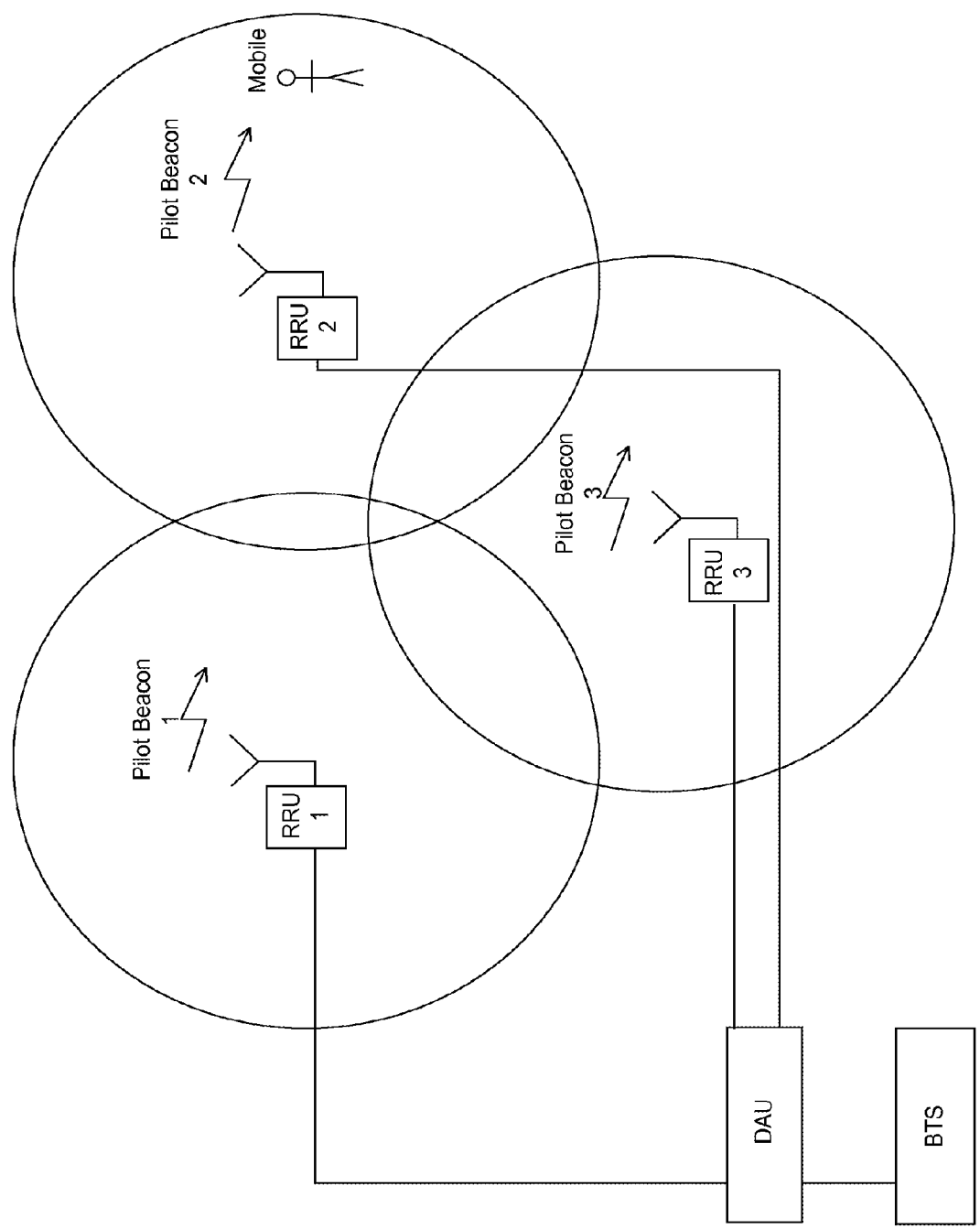
Figure 3 Pilot Beacon Indoor Localization System for CDMA and WCDMA

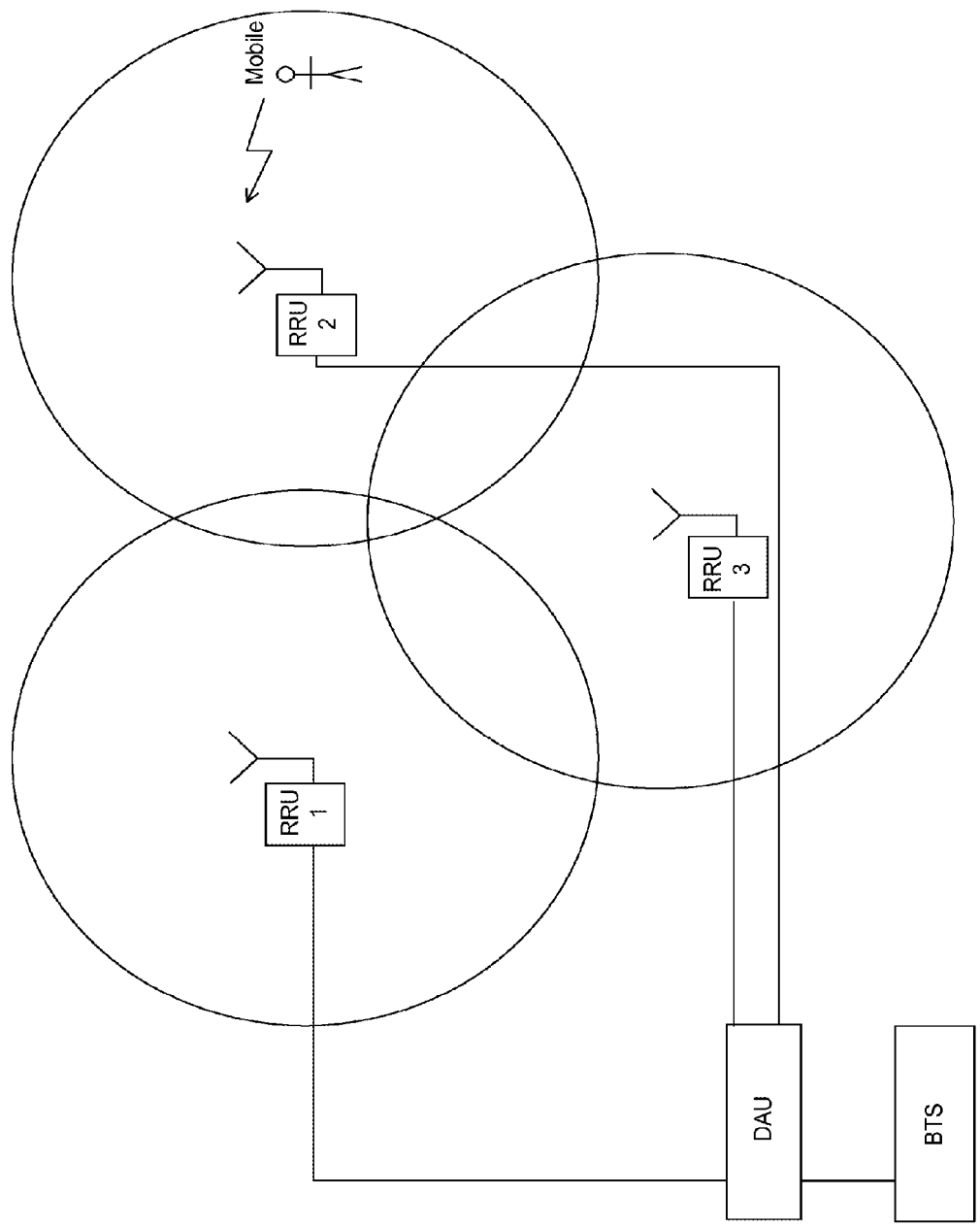
Figure 4  Indoor Localization System of GSM and LTE

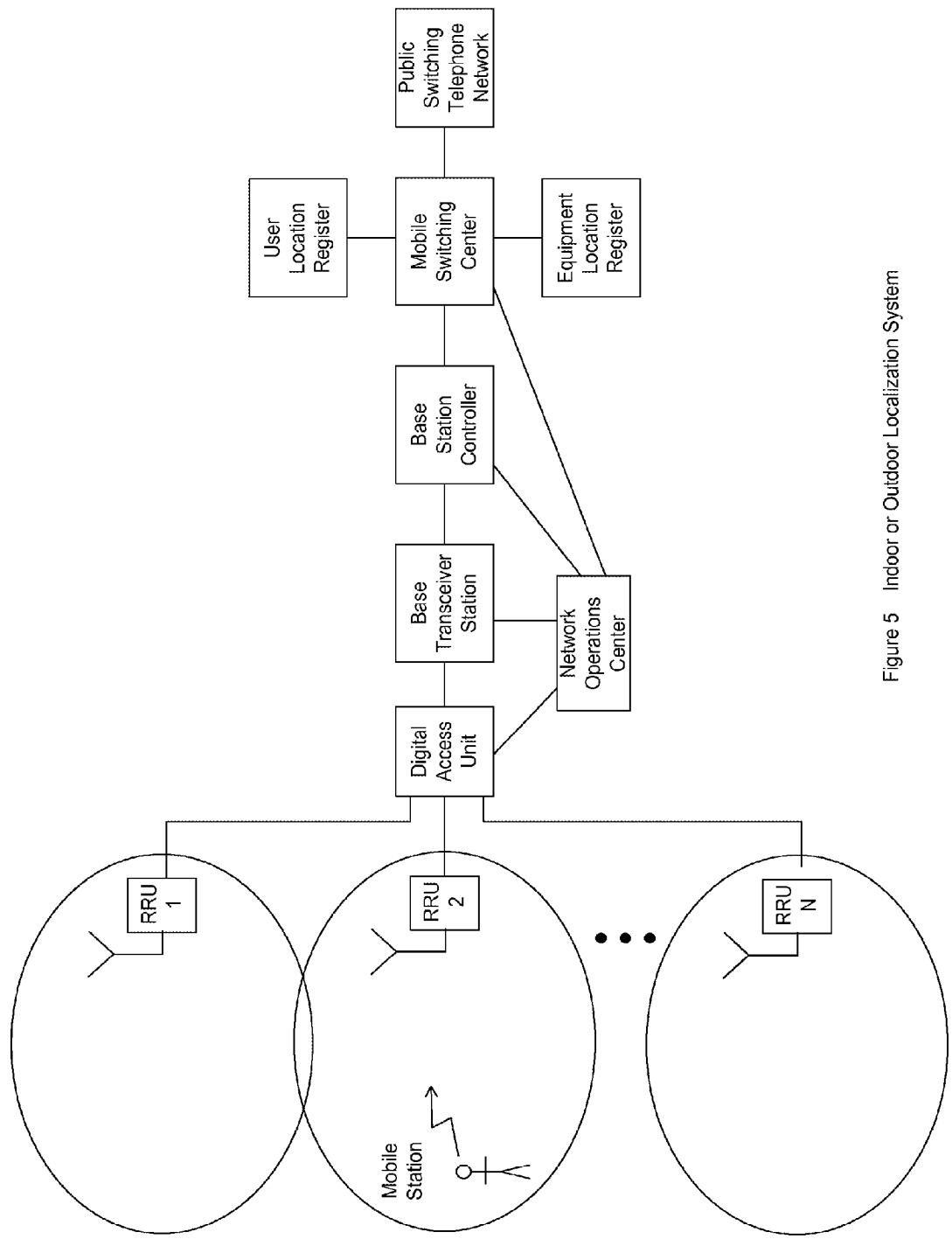
Figure 5  Indoor or Outdoor Localization System

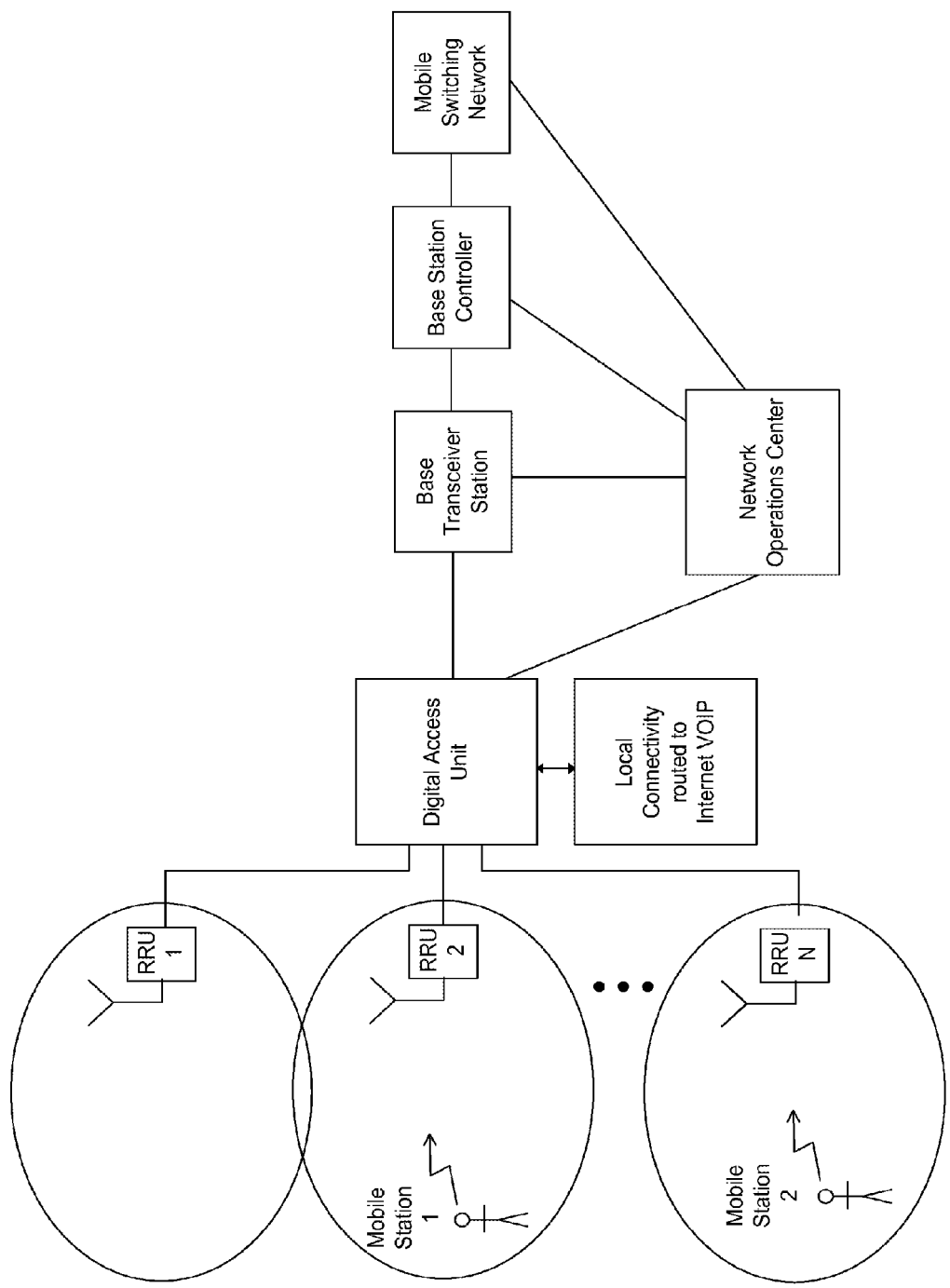
Figure 6  Local Connectivity

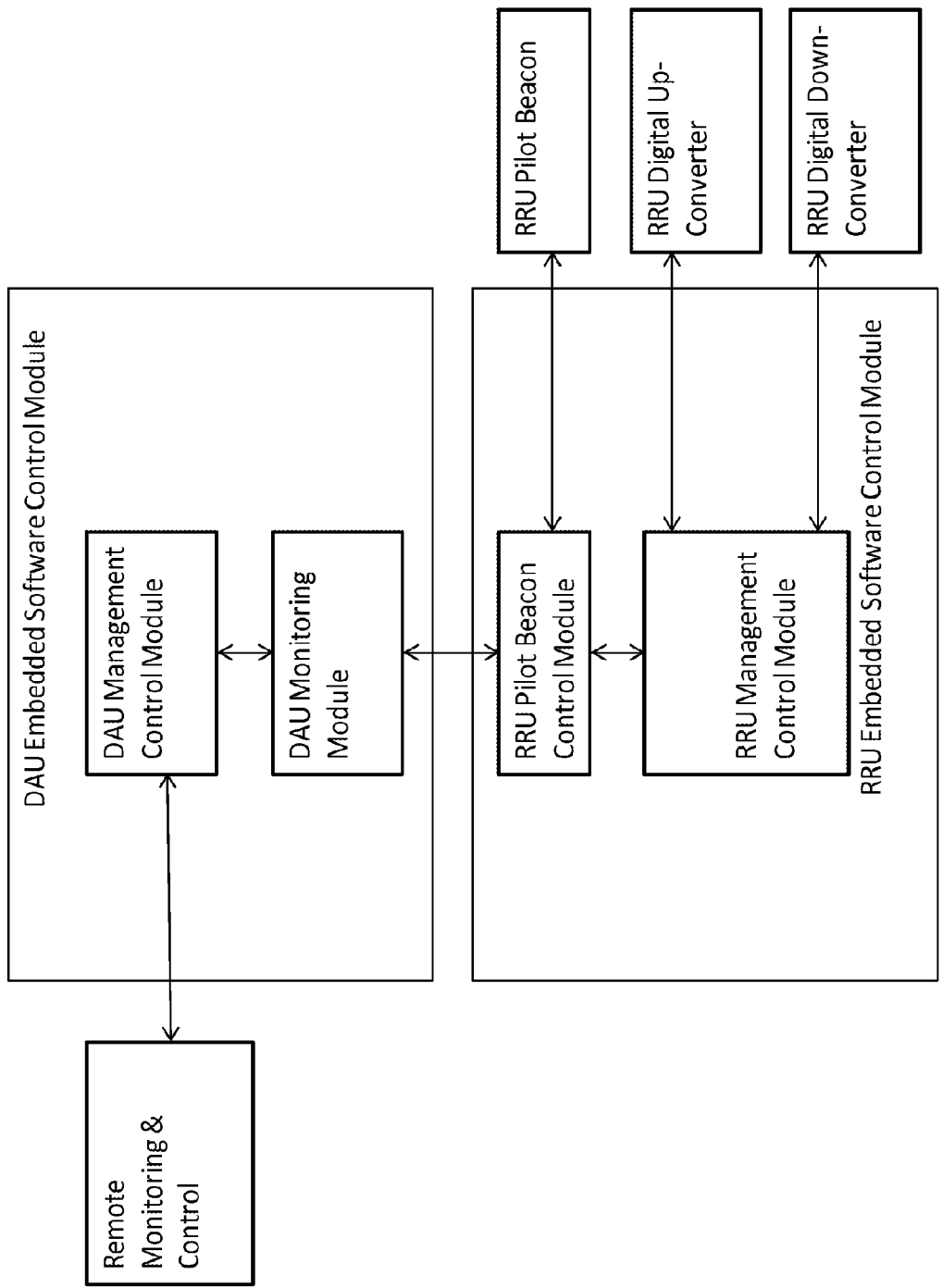
Figure 7: Embedded Software Control Modules

REMOTELY RECONFIGUREABLE DISTRIBUTED ANTENNA SYSTEM AND METHODS

CROSS-REFERENCES TO RELATED APPLICATIONS

This application is a continuation of U.S. patent application Ser. No. 13/211,243, filed on Aug. 16, 2011, entitled REMOTELY RECONFIGURABLE DISTRIBUTED ANTENNA SYSTEM AND METHODS, which claims the benefit of U.S. Patent Application No. 61/382,836, filed on Sep. 14, 2010, entitled REMOTELY RECONFIGURABLE DISTRIBUTED ANTENNA SYSTEM AND METHODS, the disclosures of which are hereby incorporated by reference for all purposes.

FIELD OF THE INVENTION

The present invention generally relates to wireless communication systems employing Distributed Antenna Systems (DAS) as part of a distributed wireless network. More specifically, the present invention relates to a DAS utilizing software defined radio (SDR).

BACKGROUND OF THE INVENTION

Wireless and mobile network operators face the continuing challenge of building networks that effectively manage high data-traffic growth rates. Mobility and an increased level of multimedia content for end users requires end-to-end network adaptations that support both new services and the increased demand for broadband and flat-rate Internet access. One of the most difficult challenges faced by network operators is caused by the physical movements of subscribers from one location to another, and particularly when wireless subscribers congregate in large numbers at one location. A notable example is a business enterprise facility during lunchtime, when a large number of wireless subscribers visit a cafeteria location in the building. At that time, a large number of subscribers have moved away from their offices and usual work areas. It's likely that during lunchtime there are many locations throughout the facility where there are very few subscribers. If the indoor wireless network resources were properly sized during the design process for subscriber loading as it is during normal working hours when subscribers are in their normal work areas, it is very likely that the lunchtime scenario will present some unexpected challenges with regard to available wireless capacity and data throughput.

To accommodate this variation in subscriber loading, there are several candidate prior art approaches.

One approach is to deploy many low-power high-capacity base stations throughout the facility. The quantity of base stations is determined based on the coverage of each base station and the total space to be covered. Each of these base stations is provisioned with enough radio resources, i.e., capacity and broadband data throughput to accommodate the maximum subscriber loading which occurs during the course of the workday and work week. Although this approach typically yields a high quality of service, the notable disadvantage of this approach is that during a major part of the time many of the base stations' capacity is being wasted. Since a typical indoor wireless network deployment involves capital and operational costs which are assessed on a per-subscriber basis for each base station, the typically high total life cycle cost for a given enterprise facility is far from optimal.

A second candidate approach involves deployment of a DAS along with a centralized group of base stations dedicated to the DAS. A conventional DAS deployment falls into one of two categories. The first type of DAS is "fixed", where the system configuration doesn't change based on time of day or other information about usage. The remote units associated with the DAS are set up during the design process so that a particular block of base station radio resources is thought to be enough to serve each small group of DAS remote units. A notable disadvantage of this approach is that most enterprises seem to undergo frequent re-arrangements and re-organizations of various groups within the enterprise. Therefore, it's highly likely that the initial setup will need to be changed from time to time, requiring deployment of additional staff and contract resources with appropriate levels of expertise regarding wireless networks.

The second type of DAS is equipped with a type of network switch which allows the location and quantity of DAS remote units associated with any particular centralized base station to be changed manually. Although this approach would seem to allow dynamic reconfiguration based on the needs of the enterprise or based on time of day, it frequently requires deployment of additional staff resources for real-time management of the network. Another issue is that it's not always correct or best to make the same DAS remote unit configuration changes back and forth on each day of the week at the same times of day. Frequently it is difficult or impractical for an enterprise IT manager to monitor the subscriber loading on each base station. And it is almost certain that the enterprise IT manager has no practical way to determine the loading at a given time of day for each DAS remote unit; they can only guess.

Another major limitation of prior art DAS deployments is related to their installation, commissioning and optimization process. Some challenging issues which must be overcome include selecting remote unit antenna locations to ensure proper coverage while minimizing downlink interference from outdoor macro cell sites, minimizing uplink interference to outdoor macro cell sites, and ensuring proper intra-system handovers while indoors and while moving from outdoors to indoors (and vice-versa). The process of performing such deployment optimization is frequently characterized as trial-and-error and as such, the results may not be consistent with a high quality of service.

A major limitation of prior art DAS equipment employing digital transmission links such as optical fiber or wired Ethernet is the fact that the prior-art RF-to-digital conversion techniques utilize an approach whereby the system converts a single broad RF bandwidth of e.g., 10 to 25 MHz to digital. Therefore all the signals, whether weak or strong, desired or undesired, contained within that broad bandwidth are converted to digital, whether those signals are desired or not. This approach frequently leads to inefficiencies within the DAS which limit the DAS network capacity. It would be preferable to employ an alternative approach yielding greater efficiencies and improved flexibility, particularly for neutral host applications.

In 2008 the FCC further clarified its E-911 requirements with regard to Phase 2 accuracy for mobile wireless networks. The information required in Phase 2 is the mobile phone number and the physical location, within a few dozen yards, from which the call was made. The Canadian government is reportedly considering enacting similar requirements. Also the FCC is eager to see US mobile network operators provide positioning services with enhanced accuracy for E-911 for indoor subscribers. There is a reported effort within the FCC to try to mandate Phase 2 accuracy indoors, within the next 2 years.

Many wireless networks employ mobile and fixed broadband wireless terminals which employ GPS-based E-911 location services. It has been demonstrated that GPS signals from satellites outdoors don't propagate well into the indoor space. Therefore an alternative, more robust E-911 location determination approach is required for indoors, particularly if the FCC requirements are changed to be more stringent.

Several US operators have expressed concern about how they can practically and cost-effectively obtain these enhanced location accuracy capabilities. Operators are very eager to identify a cost-effective approach which can be deployed indoors for enhanced location accuracy.

One proposed approach toward indoor location accuracy enhancement for CDMA networks would employ a separate unit known as a CDMA Pilot Beacon. A notable disadvantage of this approach for an indoor OAS application is that since the CDMA Pilot Beacon unit is a separate and dedicated device and not integrated within the OAS, it would likely be costly to deploy. The Pilot Beacon approach for CDMA networks employs a Pilot Beacon with a unique PN code (in that area) which effectively divides a particular CDMA network coverage area (e.g., indoors) into multiple small zones (which each correspond to the coverage area of a low-power Pilot Beacon). Each Pilot Beacon's location, PN code and RF Power level are known by the network. Each Pilot Beacon must be synchronized to the CDMA network, via GPS or local base station connection. A variable delay setting permits each Pilot Beacon to have the appropriate system timing to permit triangulation and/or Cell 10 position determination. One optional but potentially costly enhancement to this approach would employ a Wireless Modem for each Pilot Beacon to provide remote Alarms, Control and Monitoring of each CDMA Pilot Beacon. No known solution for indoor location accuracy enhancement has been publicly proposed for WCDMA networks.

One candidate technically-proven approach toward indoor location accuracy enhancement for GSM networks would employ a separate unit known as a Location Measurement Unit or LMU. A notable disadvantage of this approach for an indoor DAS application is that, since the LMU is a separate and dedicated device and not integrated within the DAS, it is costly to deploy. Each LMU requires a backhaul facility to a central server which analyzes the LMU measurements. The LMU backhaul cost adds to the total cost of deploying the enhanced accuracy E-911 solution for GSM networks. Despite the availability of the already technically-proven LMU approach, it has not been widely deployed in conjunction with indoor DAS.

Based on the prior art approaches described herein, it is apparent that a highly efficient, easily deployed and dynamically reconfigurable wireless network is not achievable with prior art systems and capabilities.

BRIEF SUMMARY OF THE INVENTION

The present invention substantially overcomes the limitations of the prior art discussed above. The advanced system architecture of the present invention provides a high degree of flexibility to manage, control, enhance and facilitate radio resource efficiency, usage and overall performance of the distributed wireless network. This advanced system architecture enables specialized applications and enhancements including flexible simulcast, automatic traffic load-balancing, network and radio resource optimization, network calibration, autonomous/assisted commissioning, carrier pooling, automatic frequency selection, radio frequency carrier placement, traffic monitoring, traffic tagging, and indoor location determination using pilot beacons. The present invention can also serve multiple operators, multi-mode radios (modulation-independent) and multi-frequency bands per operator to increase the efficiency and traffic capacity of the operators' wireless networks.

Accordingly, it is an object of the present invention to provide a capability for Flexible Simulcast. With Flexible Simulcast, the amount of radio resources (such as RF carriers, CDMA codes or TDMA time slots) assigned to a particular RRU or group of RRUs by each RRU Access Module can be set via software control as described hereinafter to meet desired capacity and throughput objectives or wireless subscriber needs. To achieve these and other objects, an aspect of the present invention employs software-programmable frequency selective Digital Up-Converters (DUCs) and Digital Down-Converters (DDCs). A software-defined Remote Radio Head architecture is used for cost-effective optimization of the radio performance. Frequency selective DDCs and DUCs at the Remote Radio Head enable a high signal to noise ratio (SNR) which maximize the throughput data rate. An embodiment shown in FIG. 1 depicts a basic structure and provides an example of a Flexible Simulcast downlink transport scenario. FIG. 2 depicts an embodiment of a basic structure of a Flexible Simulcast uplink transport scenario.

It is a further object of the present invention to facilitate conversion and transport of several discrete relatively narrow RF bandwidths. In another aspect of the invention, an embodiment converts only that plurality of specific, relatively narrow bandwidths that carry useful information. Thus, this aspect of the present invention allows more efficient use of the available optical fiber transport bandwidth for neutral host applications, and facilitates transport of more operators' band segments over the optical fiber. To achieve the above result, the present invention utilizes frequency-selective filtering at the Remote Radio Head which enhances the system performance. In some embodiments of this aspect of the invention, noise reduction via frequency-selective filtering at the Remote Radio Head is utilized for maximizing the SNR and consequently maximizing the data throughput. It is a further object of the present invention to provide CDMA and WCDMA indoor location accuracy enhancement. In an aspect of the present invention, an embodiment provides enhanced location accuracy performance by employing pilot beacons. FIG. 3 depicts a typical indoor system employing multiple Remote Radio Head Units (RRUs) and a central Digital Access Unit (DAU). The Remote Radio Heads have a unique beacon that is distinct and identifies that particular indoor cell. The mobile user will use the beacon information to assist in the localization to a particular cell.

It is a further object of the present invention to enhance GSM and LTE indoor location accuracy. In another aspect, an embodiment of the present invention provides localization of a user based on the radio signature of the mobile device. FIG. 4 depicts a typical indoor system employing multiple Remote Radio Head Units (RRUs) and a central Digital Access Unit (DAU). In accordance with the invention, each Remote Radio Head provides unique header information on data received by that Remote Radio Head. The system of the invention uses this header information in conjunction with the mobile user's radio signature to localize the user to a particular cell. It is a further object of the present invention to re-route local traffic to Internet VOIP, Wi-Fi or WiMAX. In this aspect of the invention, an embodiment determines the radio signatures of the individual users within a DAU or Island of DAUs and uses this information to identify if the users are located within the coverage area associated with a specific DAU or Island of DAUs. The DAUs track the radio signatures of all the active users within its network and record a running data base containing information pertaining to them. One embodiment of the present invention is for the Network Operations Center (NOC) to inform the DAU that, e.g., two specific users are collocated within the same DAU or Island of DAUs, as depicted in FIG. 6. The DAUs then reroute the users to Internet VOIP, Wi-Fi or WiMAX as appropriate. Another embodiment of the present invention is to determine the Internet Protocol (IP) addresses of the individual users' Wi-Fi connections. If the individual users' IP addresses are within the same DAU or Island of DAUs, the data call for these users is rerouted over the internal network.

Applications of the present invention are suitable to be employed with distributed base stations, distributed antenna systems, distributed repeaters, mobile equipment and wireless terminals, portable wireless devices, and other wireless communication systems such as microwave and satellite communications. The present invention is also field upgradable through a link such as an Ethernet connection to a remote computing center.

Appendix I is a glossary of terms used herein, including acronyms.

BRIEF DESCRIPTION OF THE DRAWINGS

Further objects and advantages of the present invention can be more fully understood from the following detailed description taken in conjunction with the accompanying drawings in which:

FIG. 1 is a block diagram according to one embodiment of the invention showing the basic structure and an example of a Flexible Simulcast downlink transport scenario based on having 2 DAU and 4 DRU.

FIG. 2 is a block diagram in accordance with an embodiment of the invention showing the basic structure and an example of a Flexible Simulcast uplink transport scenario based on having 2 DAU and 4 DRU.

FIG. 3 shows an embodiment of an indoor system employing multiple Remote Radio Head Units (RRUs) and a central Digital Access Unit (DAU).

FIG. 4 shows an embodiment of an indoor system in accordance with the invention which employs multiple Remote Radio Head Units (RRUs) and a central Digital Access Unit (DAU).

FIG. 5 illustrates an embodiment of a cellular network system employing multiple Remote Radio Heads according to the present invention.

FIG. 6 is a depiction of local connectivity according to one embodiment of the present invention.

FIG. 7 illustrates an embodiment of the basic structure of the embedded software control modules which manage key functions of the DAU and RRU, in accordance with the present invention.

DETAILED DESCRIPTION OF THE INVENTION

The present invention is a novel Reconfigurable Distributed Antenna System that provides a high degree of flexibility to manage, control, re-configure, enhance and facilitate the radio resource efficiency, usage and overall performance of the distributed wireless network. An embodiment of the Reconfigurable Distributed Antenna System in accordance with the present invention is shown in FIG. 1. The Flexible Simulcast System 100 can be used to explain the operation of Flexible Simulcast with regard to downlink signals. The system employs a Digital Access Unit functionality (hereinafter "DAU"). The DAU serves as an interface to the base station (BTS). The DAU is (at one end) connected to the BTS, and on the other side connected to multiple RRUs. For the downlink (DL) path, RF signals received from the BTS are separately down-converted, digitized, and converted to baseband (using a Digital Down-Converter). Data streams are then I/Q mapped and framed. Specific parallel data streams are then independently serialized and translated to optical signals using pluggable SFP modules, and delivered to different RRUs over optical fiber cable. For the uplink (UL) path optical signals received from RRUs are deserialized, deframed, and up-converted digitally using a Digital Up-Converter. Data streams are then independently converted to the analog domain and up-converted to the appropriate RF frequency band. The RF signal is then delivered to the BTS. An embodiment of the system is mainly comprised of DAU1 indicated at 101, RRU1 indicated at 103, RRU2 indicated at 104, DAU2 indicated at 102, RRU3 indicated at 105, and RRU4 indicated at 106. A composite downlink input signal 107 from, e.g., a base station belonging to one wireless operator enters DAU1 at the DAU1 RF input port. Composite signal 107 is comprised of Carriers 1-4. A second composite downlink input signal from e.g., a second base station belonging to the same wireless operator enters DAU2 at the DAU2 RF input port. Composite signal 108 is comprised of Carriers 5-8. The functionality of DAU1, DAU2, RRU1, RRU2, RRU3 and RRU4 are explained in detail by U.S. Provisional Application Ser. No. 61/374,593, entitled "Neutral Host Architecture for a Distributed Antenna System," filed Aug. 17, 2010 and attached hereto as an appendix. One optical output of DAU1 is fed to RRU1. A second optical output of DAU1 is fed via bidirectional optical cable 113 to DAU2. This connection facilitates networking of DAU1 and DAU2, which means that all of Carriers 1-8 are available within DAU1 and DAU2 to transport to RRU1, RRU2, RRU3 and RRU4 depending on software settings within the networked DAU system comprised of DAU1 and DAU2. The software settings within RRU1 are configured either manually or automatically such that Carriers 1-8 are present in the downlink output signal 109 at the antenna port of RRU1. The presence of all 8 carriers means that RRU1 is potentially able to access the full capacity of both base stations feeding DAU1 and DAU2. A possible application for RRU1 is in a wireless distribution system is e.g., a cafeteria in an enterprise building during the lunch hour where a large number of wireless subscribers are gathered. RRU2 is fed by a second optical port of RRU1 via bidirectional optical cable 114 to RRU2. Optical cable 114 performs the function of daisy chaining RRU2 with RRU1. The software settings within RRU2 are configured either manually or automatically such that Carriers 1, 3, 4 and 6 are present in downlink output signal 110 at the antenna port of RRU2. The capacity of RRU2 is set to a much lower value than RRU1 by virtue of its specific Digital Up Converter settings. The individual Remote Radio Units have integrated frequency selective DUCs and DDCs with gain control for each carrier. The DAUs can remotely turn on and off the individual carriers via the gain control parameters.

In a similar manner as described previously for RRU1, the software settings within RRU3 are configured either manually or automatically such that Carriers 2 and 6 are present in downlink output signal 111 at the antenna port of RRU3. Compared to the downlink signal 110 at the antenna port of RRU2, the capacity of RRU3 which is configured via the software settings of RRU3 is much less than the capacity of RRU2. RRU4 is fed by a second optical port of RRU3 via bidirectional optical cable 115 to RRU4. Optical cable 115 performs the function of daisy chaining RRU4 with RRU3. The software settings within RRU4 are configured either manually or automatically such that Carriers 1, 4, 5 and 8 are present in downlink output signal 112 at the antenna port of RRU4. The capacity of RRU4 is set to a much lower value than RRU1. The relative capacity settings of RRU1, RRU2, RRU3 and RRU4 and can be adjusted dynamically as discussed in connection with FIG. 7 to meet the capacity needs within the coverage zones determined by the physical positions of antennas connected to RRU1, RRU2, RRU3 and RRU4 respectively.

The present invention facilitates conversion and transport of several discrete relatively narrow RF bandwidths. This approach allows conversion of only those multiple specific relatively narrow bandwidths which carry useful or specific information. This approach also allows more efficient use of the available optical fiber transport bandwidth for neutral host applications, and allows transport of more individual operators' band segments over the optical fiber. As disclosed in U.S. Provisional Application Ser. No. 61/374,593, entitled "Neutral Host Architecture for a Distributed Antenna System," filed Aug. 17, 2010 and also referring to FIG. 1 of the instant patent application, Digital Up Converters located within the RRU which are dynamically software-programmable as discussed hereinafter can be re-configured to transport from the DAU input to any specific RRU output any specific narrow frequency band or bands, RF carriers or RF channels which are available at the respective RF input port of either DAU. This capability is illustrated in FIG. 1 where only specific frequency bands or RF carriers appear at the output of a given RRU.

A related capability of the present invention is that not only can the Digital Up Converters located within each RRU be configured to transport any specific narrow frequency band from the DAU input to any specific RRU output, but also the Digital Up Converters within each RRU can be configured to transport any specific time slot or time slots of each carrier from the DAU input to any specific RRU output. The DAU detects which carriers and corresponding time slots are active. This information is relayed to the individual RRUs via the management control and monitoring protocol software discussed hereinafter. This information is then used, as appropriate, by the RRUs for turning off and on individual carriers and their corresponding time slots.

Referring to FIG. 1 of the instant patent application, an alternative embodiment of the present invention may be described as follows. In a previous description of FIG. 1, a previous embodiment involved having downlink signals from two separate base stations belonging to the same wireless operator enter DAU1 and DAU2 input ports respectively. In an alternative embodiment, a second composite downlink input signal from e.g., a second base station belonging to a different wireless operator enters DAU2 at the DAU2 RF input port. In this embodiment, signals belonging to both the first operator and the second operator are converted and transported to RRU1, RRU2, RRU3 and RRU4 respectively. This embodiment provides an example of a neutral host wireless system, where multiple wireless operators share a common infrastructure comprised of DAU1, DAU2, RRU1, RRU2, RRU3 and RRU4. All the previously mentioned features and advantages accrue to each of the two wireless operators.

As disclosed in U.S. Provisional Application Ser. No. 61/374,593, entitled "Neutral Host Architecture for a Distributed Antenna System," filed Aug. 17, 2010 and also referring to FIG. 1 of the instant patent application, the Digital Up Converters present in the RRU can be programmed to process various signal formats and modulation types including FDMA, CDMA, TDMA, OFDMA and others. Also, the Digital Up Converters present in the respective RRUs can be programmed to operate with signals to be transmitted within various frequency bands subject to the capabilities and limitations of the system architecture disclosed in U.S. Provisional Application Ser. No. 61/374,593, entitled "Neutral Host Architecture for a Distributed Antenna System," filed Aug. 17, 2010. In one embodiment of the present invention where a wideband CDMA signal is present within e.g., the bandwidth corresponding to carrier 1 at the input port to DAU1, the transmitted signal at the antenna ports of RRU1, RRU2 and RRU4 will be a wideband CDMA signal which is virtually identical to the signal present within the bandwidth corresponding to carrier 1 at the input port to DAU1.

As disclosed in U.S. Provisional Application Ser. No. 61/374,593, entitled "Neutral Host Architecture for a Distributed Antenna System," filed Aug. 17, 2010 and also referring to FIG. 1 of the instant patent application, it is understood that the Digital Up Converters present in the respective RRUs can be programmed to transmit any desired composite signal format to each of the respective RRU antenna ports. As an example, the Digital Up Converters present in RRU1 and RRU2 can be dynamically software-reconfigured as described previously so that the signal present at the antenna port of RRU1 would correspond to the spectral profile shown in FIG. 1 as 110, and also that the signal present at the antenna port of RRU2 would correspond to the spectral profile shown in FIG. 1 as 109. The application for such a dynamic rearrangement of RRU capacity would be e.g., if a company meeting were suddenly convened in the area of the enterprise corresponding to the coverage area of RRU2. Although the description of some embodiments in the instant application refers to base station signals 107 and 108 as being on different frequencies, the system and method of the present invention readily supports configurations where one or more of the carriers which are part of base station signals 107 and 108 and are identical frequencies, since the base station signals are digitized, packetized, routed and switched to the desired RRU.

Another embodiment of the Distributed Antenna System in accordance with the present invention is shown in FIG. 2. As disclosed in U.S. Provisional Application Ser. No. 61/374, 593, entitled "Neutral Host Architecture for a Distributed Antenna System," filed Aug. 17, 2010 and also as shown in FIG. 2 the Flexible Simulcast System 200 can be used to explain the operation of Flexible Simulcast with regard to uplink signals. As discussed previously with regard to downlink signals and by referring to FIG. 1, the uplink system shown in FIG. 2 is mainly comprised of DAU1 indicated at 201, RRU1 indicated at 203, RRU2 indicated at 204, DAU2 indicated at 202, RRU3 indicated at 205, and RRU4 indicated at 206. In a manner similar to the downlink operation explained by referring to FIG. 1, the operation of the uplink system shown in FIG. 2 can be understood as follows.

The Digital Down Converters present in each of RRU1, RRU2, RRU3 and RRU4 are dynamically software-configured as described previously so that uplink signals of the appropriate desired signal format(s) present at the receive antenna ports of the respective RRU1, RRU2, RRU3 and RRU4 are selected based on the desired uplink band(s) to be processed and filtered, converted and transported to the appropriate uplink output port of either DAU1 or DAU2. The DAUs and RRUs frame the individual data packets corresponding to their respective radio signature using the Common Public Interface Standard (CPRI). Other Interface standards are applicable provided they uniquely identify data packets with respective RRUs. Header information is transmitted along with the data packet which identifies the RRU and DAU that corresponds to the individual data packet.

In one example for the embodiment shown in FIG. 2, RRU1 and RRU3 are configured to receive uplink signals within the Carrier 2 bandwidth, whereas RRU2 and RRU4 are both configured to reject uplink signals within the Carrier 2 bandwidth. When RRU3 receives a strong enough signal at its receive antenna port within the Carrier 2 bandwidth to be properly filtered and processed, the Digital Down Converters within RRU3 facilitate processing and conversion. Similarly, when RRU1 receives a strong enough signal at its receive antenna port within the Carrier 2 bandwidth to be properly filtered and processed, the Digital Down Converters within RRU1 facilitate processing and conversion. The signals from RRU1 and RRU3 are combined based on the active signal combining algorithm, and are fed to the base station connected to the uplink output port of DAU1. The term simulcast is frequently used to describe the operation of RRU1 and RRU3 with regard to uplink and downlink signals within Carrier 2 bandwidth. The term Flexible Simulcast refers to the fact that the present invention supports dynamic and/or manual rearrangement of which specific RRU are involved in the signal combining process for each Carrier bandwidth.

Referring to FIG. 2, the Digital Down Converters present in RRU1 are configured to receive and process signals within Carrier 1-8 bandwidths. The Digital Down Converters present in RRU2 are configured to receive and process signals within Carrier 1, 3, 4 and 6 bandwidths. The Digital Down Converters present in RRU3 are configured to receive and process signals within Carrier 2 and 6 bandwidths. The Digital Down Converters present in RRU4 are configured to receive and process signals within Carrier 1, 4, 5 and 8 bandwidths. The respective high-speed digital signals resulting from processing performed within each of the four RRU are routed to the two DAUs. As described previously, the uplink signals from the four RRUs are combined within the respective DAU corresponding to each base station.

An aspect of the present invention includes an integrated Pilot Beacon function within the each RRU. In an embodiment, each RRU comprises a unique software programmable Pilot Beacon as discussed hereinafter This approach is intended for use in CDMA and/or WCDMA indoor DAS networks. A very similar approach can be effective for indoor location accuracy enhancement for other types of networks such as LTE and WiMAX. Because each RRU is already controlled and monitored via the DAUs which comprise the network, there is no need for costly deployment of additional dedicated wireless modems for remote monitoring and control of pilot beacons.

An RRU-integrated Pilot Beacon approach is employed for both CDMA and WCDMA networks. Each operational pilot beacon function within an RRU employs a unique PN code (in that area) which effectively divides the WCDMA or CDMA indoor network coverage area into multiple small "zones" (which each correspond to the coverage area of a low-power Pilot Beacon). Each Pilot Beacon's location, PN code and RF Power level are known by the network. Each Pilot Beacon is synchronized to the WCDMA or CDMA network, via its connection to the DAU.

Unlike the transmit signal from a base station which is "dynamic", the Pilot Beacon transmit signal will be effectively "static" and its downlink messages will not change over time based on network conditions.

For a WCDMA network, in Idle mode each mobile subscriber terminal is able to perform Pilot Signal measurements of downlink signals transmitted by base stations and Pilot Beacons. When the WCDMA mobile subscriber terminal transitions to Active mode, it reports to the serving cell all its Pilot Signal measurements for base stations and for Pilot Beacons. For CDMA networks, the operation is very similar. For some RRU deployed in an indoor network, the RRU can be provisioned as either a Pilot Beacon or to serve mobile subscribers in a particular operator bandwidth, but not both.

For a WCDMA network, existing inherent capabilities of the globally-standardized networks are employed. The WCDMA mobile subscriber terminal is able to measure the strongest CPICH RSCP (Pilot Signal Code Power) in either Idle mode or any of several active modes. Also, measurements of CPICH Ec/No by the mobile subscriber terminal in either Idle mode or any of several active modes are possible. As a result, the mobile subscriber terminal reports all available RSCP and Ec/No measurements via the serving base station (whether indoor or outdoor) to the network. Based on that information, the most likely mobile subscriber terminal location is calculated and/or determined. For CDMA networks, the operation is very similar to the process described herein.

A previously described embodiment of the present invention referring to FIG. 1 involved having a wideband CDMA signal present within e.g., the bandwidth corresponding to carrier 1 at the input port to DAU1. In the previously described embodiment, the transmitted signal at the antenna ports of RRU1, RRU2 and RRU4 is a wideband CDMA signal which is virtually identical to the signal present within the bandwidth corresponding to carrier 1 at the input port to DAU1. An alternative embodiment of the present invention is one where a wideband CDMA signal is present within e.g., the bandwidth corresponding to carrier 1 at the input port to DAU1. However, in the alternative embodiment the transmitted signal at the antenna port of RRU1 differs slightly from the previous embodiment. In the alternative embodiment, a wideband CDMA signal is present within e.g., the bandwidth corresponding to carrier 1 at the input port to DAU1. The transmitted signal from RRU1 is a combination of the wideband CDMA signal which was present at the input port to DAU1, along with a specialized WCDMA pilot beacon signal. The WCDMA pilot beacon signal is intentionally set well below the level of the base station pilot signal.

A further alternative embodiment can be explained referring to FIG. 1 which applies in the case where CDMA signals are generated by the base station connected to the input port of DAU1. In this further alternative embodiment of the present invention, the transmitted signal at the antenna port of RRU1 is a combination of the CDMA signal which was present at the input port to DAU1, along with a specialized CDMA pilot beacon signal. The CDMA pilot beacon signal is intentionally set well below the level of the base station pilot signal.

An embodiment of the present invention provides enhanced accuracy for determining location of indoor wireless subscribers. FIG. 4 depicts a typical indoor system employing multiple Remote Radio Head Units (RRUs) and a central Digital Access Unit (DAU). Each Remote Radio Head provides a unique header information on data received by that Remote Radio Head. This header information in conjunction with the mobile user's radio signature are used to localize the user to a particular cell. The DAU signal processing can identify the individual carriers and their corresponding time slots. A header is included with each data packet that uniquely identifies the corresponding RRU. The DAU can detect the carrier frequency and the corresponding time slot associated with the individual RRUs. The DAU has a running data base that identifies each carrier frequency and time slot with a respective RRU. The carrier frequency and time slot is the radio signature that uniquely identifies the GSM user.

The DAU communicates with a Network Operation Center (NOC) via a Ethernet connection or an external modem, as depicted in FIG. 5. Once a E911 call is initiated the Mobile Switching Center (MSC) in conjunction with the NOC can identify the corresponding BaseTransceiver Station (BTS) where the user has placed the call. The user can be localized within a BTS cell. The NOC then makes a request to the individual DAUs to determine if the E911 radio signature is active in their indoor cell. The DAU checks its data base for the active carrier frequency and time slot. If that radio signature is active in the DAU, then that DAU will provide the NOC with the location information of the corresponding RRU.

A further embodiment of the present invention includes LTE to provide enhanced accuracy for determining the location of indoor wireless subscribers. GSM uses individual carriers and time slots to distinguish users whereas LTE uses multiple carriers and time slot information to distinguish users. The DAU can simultaneously detect multiple carriers and their corresponding time slots to uniquely identify the LTE user. The DAU has a running data base that identifies the carrier frequencies and time slot radio signature for the respective RRU. This information can be retrieved from the NOC once a request is made to the DAU.

Referring next to FIG. 7, the DAU embedded software control module and RRU embedded software control module can be better understood in connection with the operation of key functions of the DAU and RRU. One such key function is determining and/or setting the appropriate amount of radio resources (such as RF carriers, CDMA codes or TDMA time slots) assigned to a particular RRU or group of RRUs to meet desired capacity and throughput objectives. The DAU embedded software control module comprises a DAU Monitoring module that detects which carriers and corresponding time slots are active for each RRU. The DAU embedded software control module also comprises a DAU Management Control module which communicates with the RRU over a fiber optic link control channel via a control protocol with the RRU Management Control module. In turn, the RRU Management Control module sets the individual parameters of all the RRU Digital Up-Converters to enable or disable specific radio resources from being transmitted by a particular RRU or group of RRUs, and also sets the individual parameters of all the RRU Digital Down-Converters to enable or disable specific uplink radio resources from being processed by a particular RRU or group of RRUs.

In an embodiment, an algorithm operating within the DAU Monitoring module, that detects which carriers and corresponding time slots for each carrier are active for each RRU, provides information to the DAU Management Control module to help identify when, e.g., a particular downlink carrier is loaded by a percentage greater than a predetermined threshold whose value is communicated to the DAU Management Control module by the DAU's Remote Monitoring and Control function. If that occurs, the DAU Management Control module adaptively modifies the system configuration to slowly begin to deploy additional radio resources (such as RF carriers, CDMA codes or TDMA time slots) for use by a particular RRU which need those radio resources within its coverage area. At the same time, in at least some embodiments the DAU Management Control module adaptively modifies the system configuration to slowly begin to remove certain radio resources (such as RF carriers, CDMA codes or TDMA time slots) for use by a particular RRU which no longer needs those radio resources within its coverage area. Another such key function of the DAU embedded software control module and RRU embedded software control module is determining and/or setting and/or analyzing the appropriate transmission parameters and monitoring parameters for the integrated Pilot Beacon function contained within each RRU. These Pilot Beacon transmission and monitoring parameters include Beacon Enable/Disable, Beacon Carrier Frequencies, Beacon Transmit Power, Beacon PN Code, Beacon Downlink BCH Message Content, Beacon Alarm, Beacon Delay Setting and Beacon Delay Adjustment Resolution. The RRU Pilot Beacon Control module communicates with the pilot beacon generator function in the RRU to set and monitor the pilot beacon parameters as listed herein.

In summary, the Reconfigurable Distributed Antenna System of the present invention described herein efficiently conserves resources and reduces costs. The reconfigurable system is adaptive or manually field-programmable, since the algorithms can be adjusted like software in the digital processor at any time.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A system for transmitting signals, comprising:
a plurality of remote radio units; and
a plurality of digital access units each coupled to another one of the plurality of digital access units via a bidirectional cable, wherein one of the plurality of digital access units is coupled to a first base station, the one of the plurality of digital access units configured to communicate with at least a first portion of the plurality of remote radio units, and wherein another one of the plurality of digital access units is coupled to a second base station, the another one of the plurality of digital access units configured to communicate with at least a second portion of the plurality of remote radio units,
wherein the first portion of the plurality of remote radio units are each configured to packetize first uplink signals for transmission to the one of the plurality of digital access units, and the one of the plurality of digital access units is configured to packetize first downlink signals for transmission to the first portion of the plurality of remote radio units, and
wherein the second portion of the plurality of remote radio units are each configured to packetize second uplink signals for transmission to the another one of the plurality of digital access units, and the another one of the plurality of digital access units is configured to packetize second downlink signals for transmission to the second portion of the plurality of remote radio units.

2. The system of claim 1 wherein the first downlink signals correspond to a first plurality of carriers, and each of the first portion of the plurality of remote radio units is configured to receive or transmit a respective subset of the first plurality of carriers, and wherein the second downlink signals correspond to a second plurality of carriers, and each of the second portion of the plurality of remote radio units is configured to receive or transmit a respective subset of the second plurality of carriers.

3. The system of claim 1 wherein the first portion of the plurality of remote radio units are interconnected with each other in a daisy chain configuration via bidirectional fiber optic cables, and the second portion of the plurality of remote radio units are interconnected with each other in a daisy chain configuration via bidirectional fiber optic cables.

4. The system of claim 1 wherein a first one of the first portion of the plurality of remote radio units is coupled to the one of the plurality of digital access units using a first bidirectional cable, and a second one of the second portion of the plurality of remote radio units is coupled to the another one of the plurality of digital access units using a second bidirectional cable.

5. The system of claim 1 wherein the one of the plurality of digital access units and the another one of the plurality of digital access units are configured to communicate via the bidirectional cable.

6. The system of claim 1 wherein the one of the plurality of digital access units is configured to transmit the first uplink signals to the another one of the plurality of digital access units via the bidirectional cable.

7. The system of claim 1 wherein the one of the plurality of digital access units is configured to receive the second downlink signals from the another one of the plurality of digital access units via the bidirectional cable, and the one of the plurality of digital access units is configured to transmit the second downlink signals to the first portion of the plurality of remote radio units.

8. The system of claim 1 wherein the first downlink signals include signals from the first base station and signals from the second base station.

9. The system of claim 1 wherein the first uplink signals include signals directed to the first base station and signals directed to the second base station.

10. The system of claim 1 wherein the first downlink signals correspond to a first plurality of channels, and each of the first portion of the plurality of remote radio units is configured to receive or transmit a respective subset of the first plurality of channels, and wherein the second downlink signals correspond to a second plurality of channels, and each of the second portion of the plurality of remote radio units is configured to receive or transmit a respective subset of the second plurality of channels.

11. A system for transmitting signals, comprising:
a plurality of remote radio units; and
a plurality of digital access units each coupled to another one of the plurality of digital access, wherein a first digital access unit of the plurality of digital access units is coupled to a first signal source, the first digital access unit configured to communicate directly with a first portion of the plurality of remote radio units and to communicate with a second portion of the plurality of remote radio units via a second digital access unit of the plurality of digital access units,
wherein the first portion of the plurality of remote radio units are each configured to transmit first uplink signals, the first uplink signals including signals directed to the first digital access unit and signals directed to the second digital access unit, and the first digital access unit is configured to transmit first downlink signals to the first portion of the plurality of remote radio units, and
wherein the second portion of the plurality of remote radio units are each configured to transmit second uplink signals, the second uplink signals including signals directed to the first digital access unit and signals directed to the second digital access unit, and the second digital access unit is configured transmit second downlink signals to the second portion of the plurality of remote radio units.

12. The system of claim 11 wherein the first downlink signals correspond to a first plurality of carriers, and each of the first portion of the plurality of remote radio units is configured to receive or transmit a respective subset of the first plurality of carriers, and wherein the second downlink signals correspond to a second plurality of carriers, and each of the second portion of the plurality of remote radio units is configured to receive or transmit a respective subset of the second plurality of carriers.

13. The system of claim 11 wherein the first portion of the plurality of remote radio units are interconnected with each other in a daisy chain configuration, and the second portion of the plurality of remote radio units are interconnected with each other in a daisy chain configuration.

14. The system of claim 11 wherein a first one of the first portion of the plurality of remote radio units is coupled to the first digital access unit using a first bidirectional cable, and a second one of the second portion of the plurality of remote radio units is coupled to the second digital access unit using a second bidirectional cable.

15. The system of claim 11 wherein the first digital access unit and the second digital access unit are configured to communicate via a bidirectional cable.

16. The system of claim 11 wherein the first digital access unit is configured to transmit the first uplink signals to the second digital access unit.

17. The system of claim 11 wherein the first digital access unit is configured to receive the second downlink signals from the second digital access unit, and the first digital access unit is configured to transmit the second downlink signals to the first portion of the plurality of remote radio units.

18. The system of claim 11 wherein the first downlink signals correspond to a first plurality of channels, and each of the first portion of the plurality of remote radio units is configured to receive or transmit a respective subset of the first plurality of channels, and wherein the second downlink signals correspond to a second plurality of channels, and each of the second portion of the plurality of remote radio units is configured to receive or transmit a respective subset of the second plurality of channels.

19. A system for transmitting signals, comprising:
a plurality of remote radio units; and
a plurality of digital access units each coupled to another one of the plurality of digital access units, wherein one of the plurality of digital access units is coupled to a first signal source, and another one of the plurality of digital access units is configured to communicate with at least a portion of the plurality of remote radio units,
wherein the portion of the plurality of remote radio units are each configured to packetize first uplink signals for transmission to the another one of the plurality of digital access units, and the another one of the plurality of digital access units is configured to packetize first downlink signals for transmission to the portion of the plurality of remote radio units.

20. A system for transmitting signals, comprising:
a plurality of remote radio units; and
a plurality of digital access units each coupled to another one of the plurality of digital access units, wherein a first digital access unit of the plurality of digital access units is coupled to a first signal source and to a second digital access unit of the plurality of digital access units, the first digital access unit configured to communicate with at least a first portion of the plurality of remote radio units, and
wherein the first portion of the plurality of remote radio units are each configured to packetize first uplink signals for transmission to the first digital access unit, and the first digital access unit is configured to packetize first downlink signals for transmission to the first portion of the plurality of remote radio units.

21. A system for transmitting signals, comprising:
a plurality of remote radio units; and
a plurality of digital access units each coupled to another one of the plurality of digital access units, wherein a first digital access unit of the plurality of digital access units is coupled to a first signal source, and a second digital access unit of the plurality of digital access units is configured to communicate with at least a first portion of the plurality of remote radio units,
wherein the first portion of the plurality of remote radio units are each configured to packetize first uplink signals for transmission to the first digital access unit via the second digital access unit, and
wherein the first digital access unit is configured to packetize first downlink signals for transmission to the first portion of the plurality of remote radio units via the second digital access unit.

* * * * *